(12) United States Patent
Tsujita et al.

(10) Patent No.: US 10,288,823 B2
(45) Date of Patent: May 14, 2019

(54) OPTO-ELECTRIC HYBRID BOARD

(71) Applicant: NITTO DENKO CORPORATION, Ibaraki-shi, Osaka (JP)

(72) Inventors: Yuichi Tsujita, Ibaraki (JP); Naoyuki Tanaka, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/527,390

(22) PCT Filed: Nov. 20, 2015

(86) PCT No.: PCT/JP2015/082647
§ 371 (c)(1),
(2) Date: May 17, 2017

(87) PCT Pub. No.: WO2016/093036
PCT Pub. Date: Jun. 16, 2016

(65) Prior Publication Data
US 2017/0329079 A1 Nov. 16, 2017

(30) Foreign Application Priority Data
Dec. 10, 2014 (JP) .................................. 2014-249635

(51) Int. Cl.
*G02B 6/032* (2006.01)
*G02B 6/42* (2006.01)
(Continued)

(52) U.S. Cl.
CPC .......... *G02B 6/4214* (2013.01); *G02B 6/032* (2013.01); *H05K 1/0274* (2013.01); *G02B 6/13* (2013.01);
(Continued)

(58) Field of Classification Search
CPC .......... G02B 6/4214; G02B 6/43; G02B 5/10; G02B 7/185
See application file for complete search history.

(56) References Cited

U.S. PATENT DOCUMENTS 6,975,792 B1 * 12/2005 Goldberg ............. G02B 6/4202
385/15
7,050,691 B2 * 5/2006 Ishizaki ............... G02B 6/1221
264/1.24
(Continued)

FOREIGN PATENT DOCUMENTS

| JP | 2005-70158 A | 3/2005 |
| JP | 2005-284248 A | 10/2005 |

(Continued)

OTHER PUBLICATIONS

International Search Report dated Feb. 16, 2016, issued in counterpart application No. PCT/JP2015/082647. (2 pages).
(Continued)

*Primary Examiner* — Daniel Petkovsek
(74) *Attorney, Agent, or Firm* — Westerman, Hattori, Daniels & Adrian, LLP

(57) ABSTRACT

There is provided an opto-electric hybrid board including an optical waveguide including a linear core held between first and second cladding layers; electrical interconnect lines formed on a surface of the first cladding layer, with a light-permeable insulative layer therebetween; and a light-emitting element and a light-receiving element mounted on mounting pads of the electrical interconnect lines. Light reflecting surfaces for reflecting light are formed in end portions of the core. The light reflecting surfaces are concave surfaces curved in at least one of the width direction and the thickness direction of the core, and having a radius of curvature greater than 50 μm and less than 1500 μm as measured in the width direction of the core and a radius of
(Continued)

curvature greater than 200 μm and less than 1500 μm as measured in the thickness direction of the core.

2 Claims, 4 Drawing Sheets

(51) Int. Cl.
  *H05K 1/02* (2006.01)
  *G02B 6/13* (2006.01)
  *G02B 6/43* (2006.01)
(52) U.S. Cl.
  CPC ...... *G02B 6/43* (2013.01); *H05K 2201/10121* (2013.01)

(56) References Cited

U.S. PATENT DOCUMENTS

| | | | | |
|---|---|---|---|---|
| 7,076,125 | B2* | 7/2006 | Kouta | G01J 1/04 264/1.24 |
| 7,149,376 | B2* | 12/2006 | Uchida | G02B 6/43 385/15 |
| 8,929,693 | B2* | 1/2015 | Shin | G02B 6/12 385/123 |
| 9,335,497 | B2* | 5/2016 | Tanaka | G02B 6/4206 |
| 2004/0234224 | A1 | 11/2004 | Ishizaki et al. | |
| 2005/0074207 | A1 | 4/2005 | Shioda et al. | |
| 2005/0201694 | A1* | 9/2005 | Rosinski | G02B 6/4214 385/92 |
| 2007/0297719 | A1* | 12/2007 | Nathan | G02B 3/0056 385/32 |
| 2009/0261488 | A1* | 10/2009 | Shimizu | G02B 6/125 264/1.29 |
| 2009/0297096 | A1 | 12/2009 | Hodono | |
| 2016/0299290 | A1* | 10/2016 | Hayama | G02B 6/43 |

FOREIGN PATENT DOCUMENTS

| | | |
|---|---|---|
| JP | 2007-148455 A | 6/2007 |
| JP | 2009-258417 A | 11/2009 |
| JP | 2009-288341 A | 12/2009 |
| JP | 2010-134202 A | 6/2010 |
| JP | 2014-35435 A | 2/2014 |

OTHER PUBLICATIONS

Notification of Transmittal of Translation of the International Preliminary Report on Patentability (Form PCT/IB/338) issued in counterpart International Application No. PCT/JP2015/082647 dated Jun. 22, 2017, with Forms PCT/IB/373 and PCT/ISA/237. (8 pages).
Office Action dated Sep. 18, 2018, issued in counterpart Japanese Application No. 2014-249635, with English machine translation. (5 pages).
Office Action and Search Report dated Sep. 28, 2018, issued in counterpart Taiwanese Application No. 104138575, with English translation. (8 pages).

* cited by examiner

RELATED ART

OPTO-ELECTRIC HYBRID BOARD

TECHNICAL FIELD

The present invention relates to an opto-electric hybrid board including an optical waveguide, electrical interconnect lines and an optical element mounted on part of the electrical interconnect lines.

BACKGROUND ART

With the increase in the amount of transmission information, optical interconnect lines in addition to electrical interconnect lines have been used in recent electronic devices and the like. As an example, an opto-electric hybrid board has been proposed, as shown in FIG. 4 (see PTL 1, for example). This opto-electric hybrid board includes: an electric circuit board E1 including an insulative layer 51, and electrical interconnect lines 52 formed on the front surface of the insulative layer 51; an optical waveguide W1 [including a first cladding layer 56, a core (optical interconnect line) 57 and a second cladding layer 58] stacked on the back surface (surface opposite from the surface with the electrical interconnect lines 52 formed thereon) of the insulative layer 51 of the electric circuit board E1; and a light-emitting element 11 and a light-receiving element 12 which are mounted on portions of the surface with the electrical interconnect lines 52 formed thereon, the portions being corresponding to opposite end portions of the optical waveguide W1. In this opto-electric hybrid board, the opposite end portions of the optical waveguide W1 are formed into inclined surfaces inclined at 45 degrees with respect to the longitudinal direction (direction in which light propagates) of the core 57. Portions of the core 57 positioned at the inclined surfaces function as light reflecting surfaces 57a and 57b. Portions of the insulative layer 51 corresponding to the light-emitting element 11 and the light-receiving element 12 have respective through holes 55 for an optical path. The through holes 55 allow light L to propagate therethrough between the light-emitting element 11 and the light reflecting surface 57a provided in a first end portion and between the light-receiving element 12 and the light reflecting surface 57b provided in a second end portion.

The propagation of the light L in the aforementioned opto-electric hybrid board is performed in a manner to be described below. First, the light L is emitted from the light-emitting element 11 toward the light reflecting surface 57a in the first end portion. The light L passes through one of the through holes 55 for an optical path formed in the insulative layer 51, and then passes through the first cladding layer 56 in the first end portion (left-hand end portion as seen in FIG. 4) of the optical waveguide W1. Then, the light L is reflected from the light reflecting surface 57a in the first end portion of the optical waveguide W1 (the optical path is changed by 90 degrees), and travels through the interior of the core 57 in the longitudinal direction thereof. Then, the light L propagated in the core 57 is reflected from the light reflecting surface 57b in the second end portion (right-hand end portion as seen in FIG. 4) of the core 57 (the optical path is changed by 90 degrees), and travels toward the light-receiving element 12. Subsequently, the light L passes through and exits from the first cladding layer 56 in the second end portion. Then, the light L passes through the other of the through holes 55 for an optical path, and is received by the light-receiving element 12.

Unfortunately, the light L emitted from the light-emitting element 11 and the light L reflected from the light reflecting surface 57b in the second end portion are diffused, as shown in FIG. 4. For this reason, the light L is effectively propagated in small quantity. This results in high propagation losses of the light L.

To solve such a problem, there has been proposed a structure in which the light reflecting surface 57b is made in the form of a concave surface 69a and in which gold is evaporated onto the outside surface thereof to forma reflecting mirror 69, as shown in FIG. 5 (see PTL 2, for example). In this structure, the light L propagated in a core 67 is reflected from the concave surface 69a of the reflecting mirror 69 in an end portion of the core 67, so that the light L is collected in a light-receiving portion 12a of the light-receiving element 12. Thus, an attempt has been made to reduce the propagation losses of the light L. In FIG. 5, the reference numerals 66 and 68 designate cladding layers.

RELATED ART DOCUMENT

Patent Document

PTL 1: JP-A-2009-288341
PTL 2: JP-A-2014-35435

SUMMARY OF INVENTION

Unfortunately, the invention disclosed in PTL 2 does not give consideration to the radius of curvature and the like of the concave surface 69a of the reflecting mirror 69 to result in an insufficient reduction in the propagation losses of the light L.

In view of the foregoing, it is therefore an object of the present invention to provide an opto-electric hybrid board capable of sufficiently reducing light propagation losses.

A first aspect of the present invention is intended for an opto-electric hybrid board comprising: an optical waveguide including a linear core for an optical path, and two cladding layers holding the core therebetween; an electrical interconnect line formed on a surface of one of the cladding layers either directly or with another layer therebetween; and an optical element mounted on part of the electrical interconnect line, wherein a light reflecting surface for reflecting light, allowing the light to propagate between the core and the optical element, is formed in an end portion of the core of the optical waveguide, and wherein the light reflecting surface is in the form of any one of: (A) a concave surface curved only in a width direction of the core and having a radius of curvature having a value greater than 50 μm and less than 1500 μm; (B) a concave surface curved only in a thickness direction of the core and having a radius of curvature having a value greater than 200 μm and less than 1500 μm; and (C) a concave surface curved in the width direction and the thickness direction of the core, and having a radius of curvature having a value greater than 50 μm and less than 1500 μm as measured in the width direction of the core and a radius of curvature having a value greater than 200 μm and less than 1500 μm as measured in the thickness direction of the core.

To achieve a sufficient reduction in light propagation loss in the opto-electric hybrid board, the present inventors have directed attention toward the radius of curvature of the light reflecting surface in the form of a concave surface in the end portion of the core, and have made further studies about this. In the course of the studies, the present inventors have examined the radius of curvature of the light reflecting surface disclosed in PTL 2. Specifically, PTL 2 does not give consideration to the radius of curvature of the light reflecting surface as described above, but shows a concave surface in the thickness direction of the core in FIGS. 4 (h) and 7 thereof and describes the thicknesses of the core and the upper cladding shown in the figures in paragraphs [0040] and [0060] thereof. Based on this disclosure, the present inventors have calculated the scaling of the figures shown in PTL 2, and accordingly have calculated the actual radius of curvature of the aforementioned concave surface (light reflecting surface). As a result, the radius of curvature of the concave surface shown in FIG. 4(h) of PTL 2 is approximately 71 μm, and the radius of curvature of the concave surface shown in FIG. 7 of PTL 2 is approximately 11 μm. On the other hand, information for calculation of the radius of curvature of the concave surface as measured in the width direction of the core is not disclosed in PTL 2. The present inventors have estimated that the radius of curvature of the concave surface as measured in the width direction of the core is as large as the radius of curvature of the concave surface as measured in the thickness direction of the core, and then have actually measured the light propagation loss through the use of the concave surface having such radii of curvature as the light reflecting surface. As a result, it has been found that the measured light propagation loss is higher than that measured using the planar inclined surface in PTL 1 as the light reflecting surface.

As a result of the investigation into the cause of the higher light propagation loss, the present inventors have found that the concave surface in PTL 2 has a steep curvature (small radius of curvature) to result in an insufficient reduction in light propagation loss as mentioned above. As a result of further studies, the present inventors have achieved a sufficient reduction in light propagation loss through the use of any one of the concave surfaces (A) to (C) as the aforementioned concave surface. That is, the invention disclosed in PTL 2 cannot produce the effect of the present invention.

A second aspect of the present invention is intended for the opto-electric hybrid board wherein the concave surface is a laser-machined surface formed by laser beam machining.

In the opto-electric hybrid board according to the present invention, the light reflecting surface for reflecting light to allow the light to propagate between the core and the optical element is in the form of any one of the concave surfaces (A) to (C) described above. The opto-electric hybrid board according to the present invention therefore allows the collection of light reflected from the aforementioned concave surface (light reflecting surface) to become proper, thereby achieving a sufficient reduction in light propagation loss.

DESCRIPTION OF EMBODIMENTS

Next, an embodiment according to the present invention will now be described in detail with reference to the drawings.

Figure 1A:
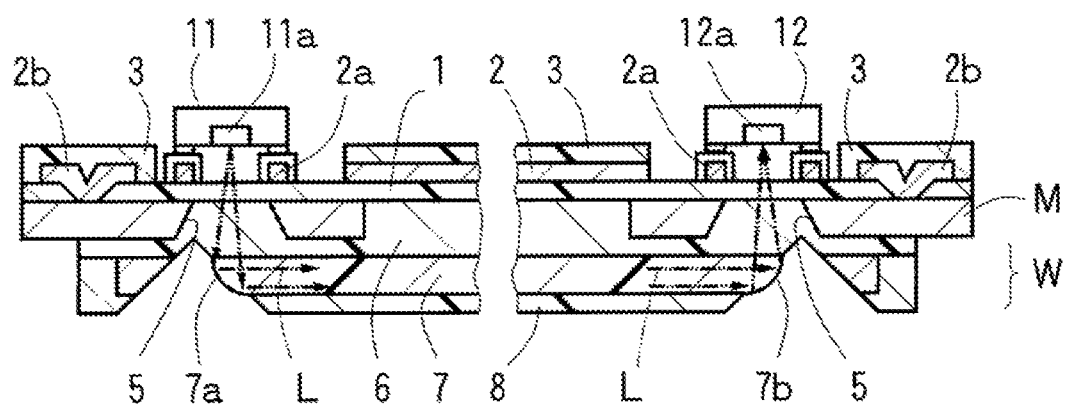
FIG. 1A is a schematic vertical sectional view of an opto-electric hybrid board according to one embodiment of the present invention.
Figure 1B:
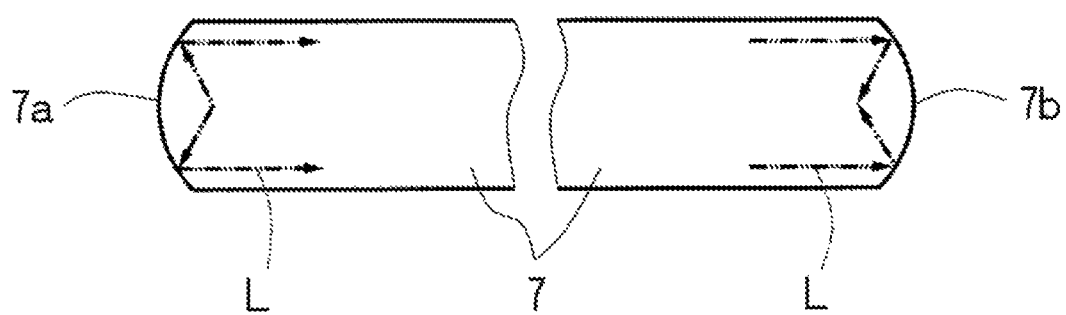
FIG. 1B is a schematic enlarged view of opposite end portions of a core as seen from below.

FIG. 1A is a schematic vertical sectional view of an opto-electric hybrid board according to one embodiment of the present invention, and FIG. 1B is a schematic enlarged view of opposite end portions of a core 7 as seen from below. The opto-electric hybrid board according to this embodiment includes: an optical waveguide W including the linear core 7 for an optical path held between a first cladding layer 6 and a second cladding layer 8; electrical interconnect lines 2 formed on a surface of the first cladding layer 6, with a light-permeable insulative layer 1 therebetween; a light-emitting element 11 and a light-receiving element 12 mounted on mounting pads 2a which are part of the electrical interconnect lines 2; and a metal layer M for reinforcement provided in portions corresponding to the mounting pads 2a between the insulative layer 1 and the first cladding layer 6. The entire opto-electric hybrid board according to this embodiment is strip-shaped. Through holes 5 for an optical path are formed in portions of the metal layer M which correspond to the light-emitting element 11 and the light-receiving element 12. Opposite end portions of the optical waveguide W corresponding to the light-emitting element 11 and the light-receiving element 12 are formed to have inclined surfaces inclined at 45 degrees with respect to the longitudinal direction of the core 7. Portions of the core 7 positioned at the inclined surfaces function as light reflecting surfaces 7a and 7b made in the form of concave surfaces. The light reflecting surfaces 7a and 7b reflect light L to achieve light propagation between the light-emitting element 11 and the core 7 and light propagation between the light-receiving element 12 and the core 7, respectively.

The core 7 has a refractive index exceeding 1. Air is present outside the light reflecting surfaces 7a and 7b, and has a refractive index of 1. In this manner, the refractive index of the core 7 is higher than that of the outside air. Thus, the light L is not transmitted through the light reflecting surfaces 7a and 7b but is reflected from the light reflecting surfaces 7a and 7b. The radius of curvature of the concave surfaces serving as the light reflecting surfaces 7a and 7b has a value greater than 50 μm and less than 1500 μm as measured in the width direction of the core 7, and has a value greater than 200 μm and less than 1500 μm as measured in the thickness direction of the core 7. Making the light reflecting surfaces 7a and 7b in the form of the concave surfaces having the aforementioned radius of curvature in this manner is a striking feature of the present invention. In FIGS. 1A and 1B, the curvature is shown as steepened (the radius of curvature is shown as decreased) for the sake of making it easier to understand that the light reflecting surfaces 7a and 7b are the concave surfaces.

The propagation of light in the opto-electric hybrid board is performed in a manner to be described below. Specifically, the light L is emitted in a diffused manner from a light-emitting portion 11a of the light-emitting element 11 toward the reflecting surface 7a in a first end portion of the core 7. The light L passes through the insulative layer 1, one of the through holes 5 for light propagation formed in the metal layer M and the first cladding layer 6 in the order named. Then, the light L is reflected from the reflecting surface 7a in the form of the concave surface in the first end portion of the core 7. The reflected light L is formed into collimated light or convergent light by the effect of the concave surface, and is sent into the core 7. Next, the light L is propagated to a second end portion of the core 7, and is reflected from the reflecting surface 7b in the form of the concave surface in the second end port ion of the core 7. The reflected light is also collected in a light-receiving portion 12a of the light-receiving element 12 by the effect of the concave surface of the reflecting surface 7b, and is received by the light-receiving portion 12a. The light-receiving portion 12a has a diameter generally in the range of 20 to 80 μm. Thus, the light is collected within the range of the light-receiving portion 12a.

In the opto-electric hybrid board, the light L emitted from the light-emitting element 11 and reflected from the reflecting surface 7a in the form of the concave surface in the first end portion of the core 7 into the core 7 is thus formed into collimated light or convergent light by the effect of the reflecting surface 7a. Also, the light L reflected from the reflecting surface 7b in the second end portion of the core 7 and received by the light-receiving element 12 is collected in the light-receiving portion 12a of the light-receiving element 12 by the effect of the reflecting surface 7b. Thus, the light L is effectively propagated in the opto-electric hybrid board, and the propagation of the light L therein is efficient.

In the opto-electric hybrid board, the distance from an interface between the first cladding layer 6 and the core 7 to the light-emitting portion 11a of the light-emitting element 11 and the distance from the interface to the light-receiving portion 12a of the light-receiving element 12 are generally in the range of 20 to 100 μm. By making the light reflecting surfaces 7a and 7b in the form of the concave surfaces having the aforementioned radius of curvature (having the value greater than 50 μm and less than 1500 μm as measured in the width direction of the core 7 and the value greater than 200 μm and less than 1500 μm as measured in the thickness direction of the core 7), the distances within this range allow the reflection of the light L from the light reflecting surfaces 7a and 7b to become proper as described above, thereby achieving a sufficient reduction in the propagation loss of the light L.

In particular, when the aforementioned distances are in the range of 70 to 100 μm, it is preferable that the radius of curvature has a value greater than 100 μm and not greater than 1300 μm as measured in the width direction of the core 7 and has a value greater than 500 μm and not greater than 1300 μm as measured in the thickness direction of the core 7. More preferably, even when the aforementioned distances are in the range of 20 μm to less than 70 μm, the radius of curvature has a value greater than 100 μm and not greater than 1300 μm as measured in the width direction of the core 7 and has a value greater than 500 μm and not greater than 1300 μm as measured in the thickness direction of the core 7.

Next, a method of manufacturing the opto-electric hybrid board will be described (with reference to FIGS. 2A to 2E and FIGS. 3A to 3D).

First, the metal layer M of a flat configuration (with reference to FIG. 2A) is prepared. Examples of a material for the formation of the metal layer M include stainless steel and alloy 42 (an iron-nickel alloy containing 42% nickel). In particular, stainless steel is preferable from the viewpoint of dimensional accuracy and the like. The metal layer M has a thickness in the range of 10 to 100 μm, for example.

Figure 2A:
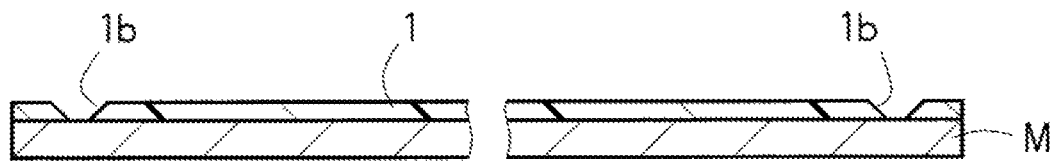
FIGS. 2A to 2D are illustrations schematically showing the steps of producing an electrical circuit board in the opto-electric hybrid board.

Next, as shown in FIG. 2A, a photosensitive insulating resin is applied to the front surface of the metal layer M to form the insulative layer 1 having a predetermined pattern by a photolithographic process. At the same time, holes 1b which uncover the front surface of the metal layer M are formed respectively in the opposite longitudinal end portions of the insulative layer 1 for the purpose of forming grounding electrodes 2b for contact with the metal layer M. The insulative layer 1 has a thickness in the range of 10 to 100 μm, for example.

Examples of a material for the formation of the insulative layer 1 include synthetic resins such as polyimide, polyether nitrile, polyether sulfone, polyethylene terephthalate, polyethylene naphthalate and polyvinyl chloride, and silicone-base sol-gel materials. In particular, a photosensitive polyimide excellent in heat resistance and in insulating properties and having a total light transmittance of not less than 70% at a wavelength of not less than 600 nm is preferable. It is also preferable that the material for the formation of the insulative layer 1 has resistance to heat at 150° C. or higher from the viewpoint of preventing deformation due to heat produced during the mounting of the light-emitting element 11 and the light-receiving element 12 (with reference to FIG. 1A). The insulative layer 1 has a thickness in the range of 3 to 100 μm, for example. It should be noted that the aforementioned value of the total light transmittance is obtained by an integral type light transmittance measuring apparatus and method defined in JIS K 7105 "Testing Methods for Optical Properties of Plastics," 5.5 "Light Transmittance and Total Light Reflectance."

Figure 2B:
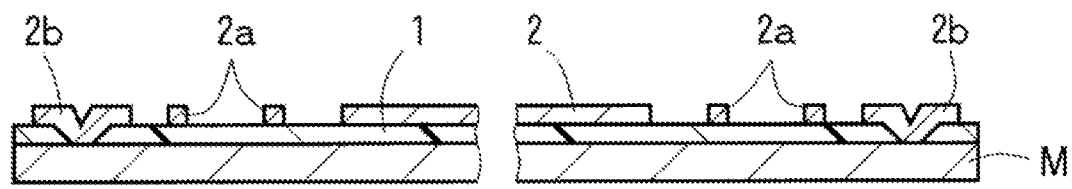

Next, as shown in FIG. 2B, the electrical interconnect lines 2 (including the mounting pads 2a and the grounding electrodes 2b) are formed by a semi-additive process, for example. The semi-additive process is as follows. First, a metal film (not shown) made of copper, chromium and the like is formed on the front surface of the insulative layer 1 by sputtering, electroless plating or the like. This metal film serves as a seed layer (layer serving as a basis material for the formation of an electroplated layer) for a subsequent electroplating process. Then, a photosensitive resist (not shown) is laminated to the opposite surfaces of a laminate comprised of the metal layer M, the insulative layer 1, and the seed layer. Thereafter, a photolithographic process is performed to form holes having the pattern of the electrical interconnect lines 2 (including the mounting pads 2a and the grounding electrodes 2b) in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer are the electrical interconnect lines 2 (including the mounting pads 2a and the grounding electrodes 2b). Although the semi-additive process is described above, a subtractive process may be used instead.

Figure 2C:
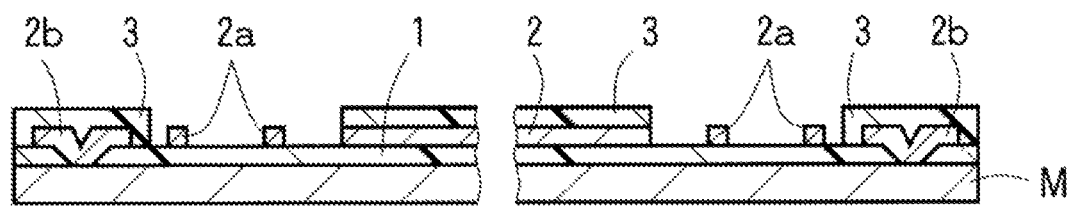

Then, an electroless plated layer made of nickel and the like (not shown) is formed on the front surface of the electrical interconnect lines 2 (including the mounting pads 2a and the grounding electrodes 2b). Thereafter, as shown in FIG. 2C, a photosensitive insulating resin including a polyimide resin and the like is applied to portions of the electrical interconnect lines 2 other than the mounting pads 2a (including the grounding electrodes 2b) to form a cover lay 3 by a photolithographic process.

Figure 2D:
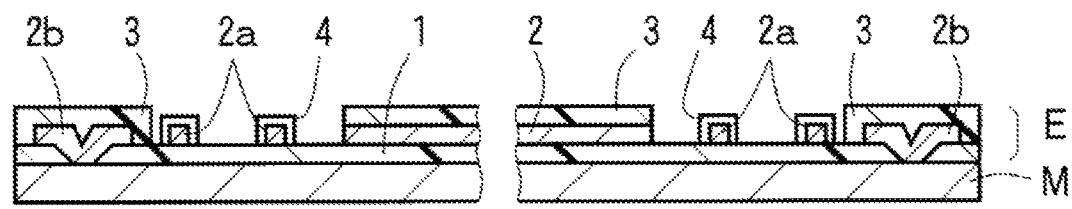

Then, the electroless plated layer (not shown) formed on the mounting pads 2a is removed by etching. Thereafter, electroplated layers 4 made of gold, nickel and the like are formed in sites where the electroless plated layer is removed, as shown in FIG. 2D. In this manner, an electric circuit board E is formed on the front surface of the metal layer M.

Next, a photosensitive resist (not shown) is laminated to the opposite surfaces of a laminate comprised of the metal layer M and the electric circuit board E. Thereafter, holes are formed by a photolithographic process in portions of the photosensitive resist on the back surface side (surface side opposite from the electric circuit board E) of the metal layer M which correspond to portions where the through holes for an optical path are to be formed and a longitudinally intermediate portion, so that back surface portions of the metal layer M are uncovered at the bottoms (top surfaces as seen in the figure) of the holes.

Figure 2E:
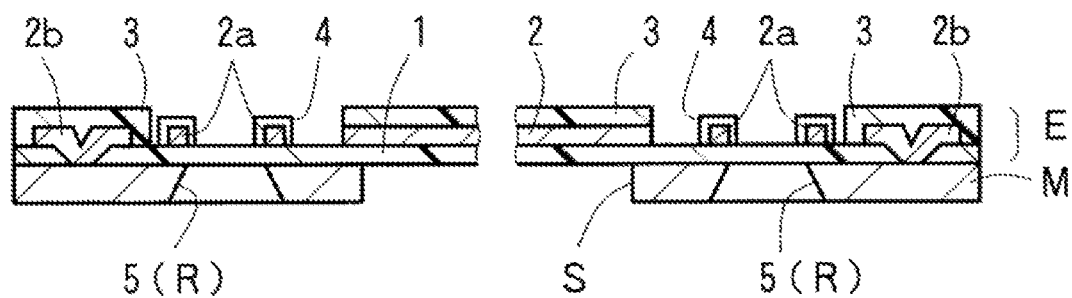
FIG. 2E is an illustration schematically showing the step of etching a metal layer in the opto-electric hybrid board.

Then, as shown in FIG. 2E, the portions of the metal layer M uncovered at the bottoms of the holes are removed by etching using an aqueous etching solution for the metal material of the metal layer M (for example, an aqueous ferric chloride solution for a stainless steel layer), so that the insulative layer 1 is uncovered at the bottoms (top surfaces as seen in the figure) of sites R and S where the metal layer M is removed. Thereafter, the photosensitive resist is stripped away using an aqueous sodium hydroxide solution and the like. The sites R where the metal layer M is removed in opposite longitudinal end portions are the through holes 5 for an optical path.

Figure 3A:
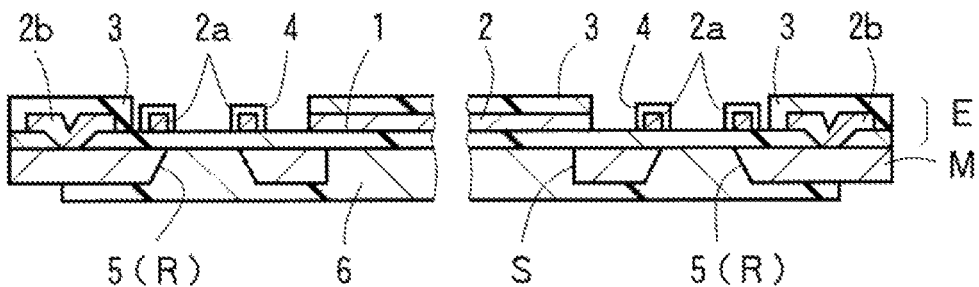
FIGS. 3A to 3D are illustrations schematically showing the steps of producing an optical waveguide in the opto-electric hybrid board.

For the formation of the optical waveguide W (with reference to FIG. 3D) on the back surface of the metal layer M, a photosensitive resin which is a material for the formation of the first cladding layer 6 is applied to the back surface (lower surface as seen in the figure) of the metal layer M, as shown in FIG. 3A. Thereafter, the applied layer is exposed to irradiation light. This exposure cures the applied layer to form the first cladding layer 6. The first cladding layer 6 is formed while entering and filling the sites R and S where the metal layer M is removed by etching. The first cladding layer 6 has a thickness (thickness as measured from the back surface of the metal layer M) in the range of 5 to 80 µm, for example. It should be noted that the back surface of the metal layer M is positioned to face upward when the optical waveguide W is formed (when the aforementioned first cladding layer 6, the core 7 to be described later and the second cladding layer 8 to be described later are formed).

Figure 3B:
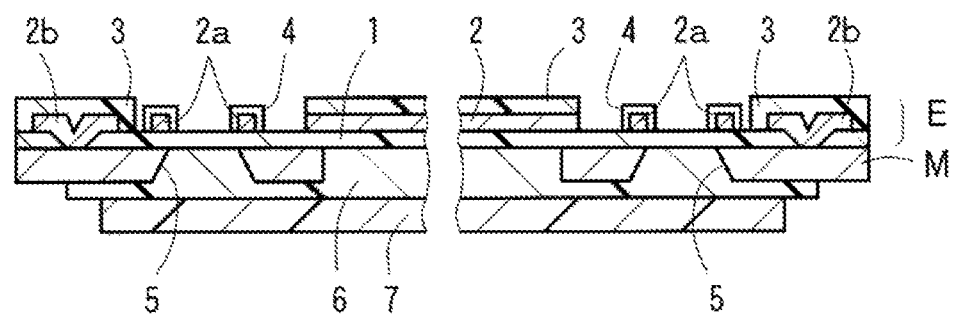

Then, as shown in FIG. 3B, the core 7 having a predetermined pattern is formed on the front surface (lower surface as seen in the figure) of the first cladding layer 6 by a photolithographic process. The core 7 has the following dimensions: a width in the range of 5 to 200 µm, and a thickness in the range of 5 to 200 µm. An example of a material for the formation of the core 7 includes a photosensitive resin similar to that for the first cladding layer 6, and the material used herein has a refractive index higher than that of the materials for the formation of the aforementioned first cladding layer 6 and the second cladding layer 8 to be described below (with reference to FIG. 3C). The adjustment of the refractive indices may be made, for example, by adjusting the selection of the types of the materials for the formation of the first cladding layer 6, the core 7 and the second cladding layer 8, and the composition ratio thereof.

Figure 3C:
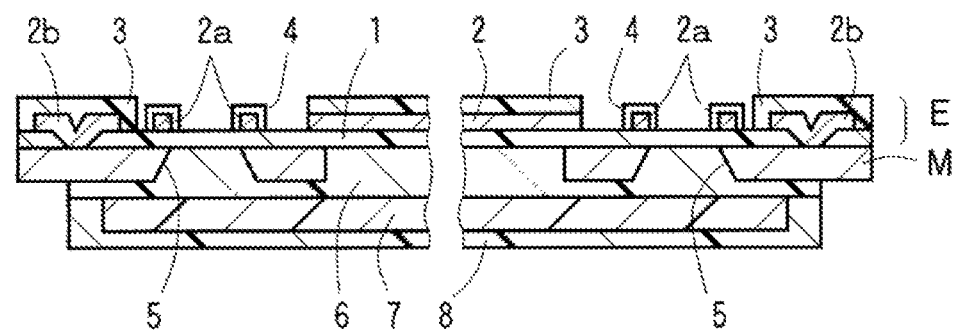

Next, as shown in FIG. 3C, the second cladding layer 8 is formed on the front surface (lower surface as seen in the figure) of the first cladding layer 6 by a photolithographic process so as to cover the core 7. The second cladding layer 8 has a thickness (thickness as measured from the front surface of the first cladding layer 6) greater than that of the core 7, e.g. not greater than 500 µm. An example of the material for the formation of the second cladding layer 8 includes a photosensitive resin similar to that for the first cladding layer 6.

Figure 3D:
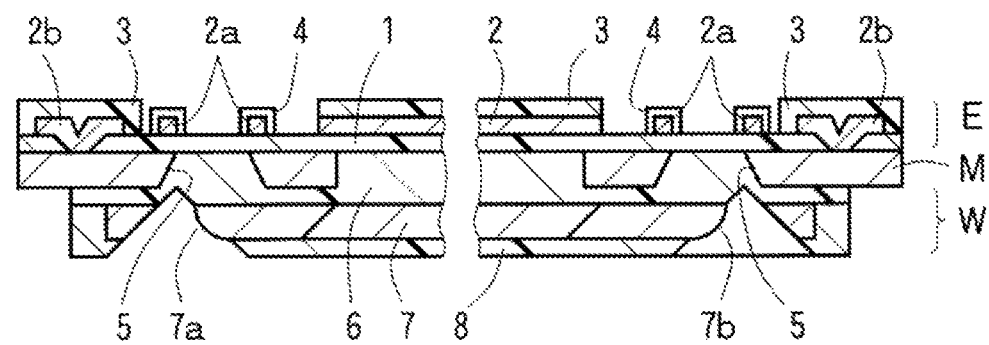
Figure 4:
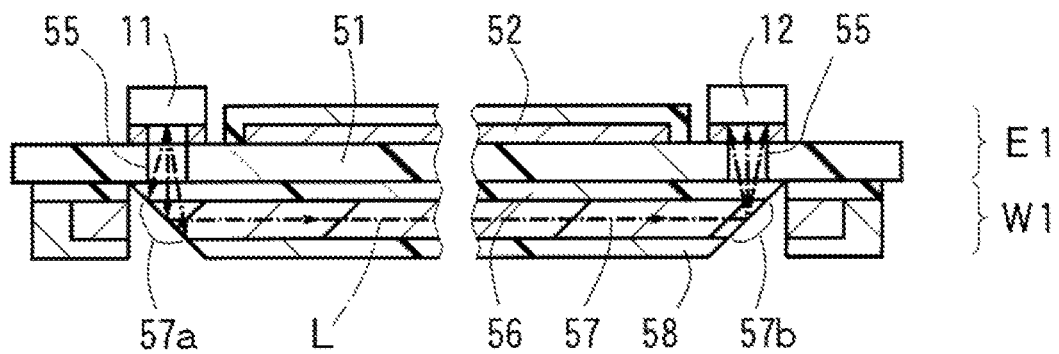
FIG. 4 is a schematic vertical sectional view of a conventional opto-electric hybrid board.
Figure 5:
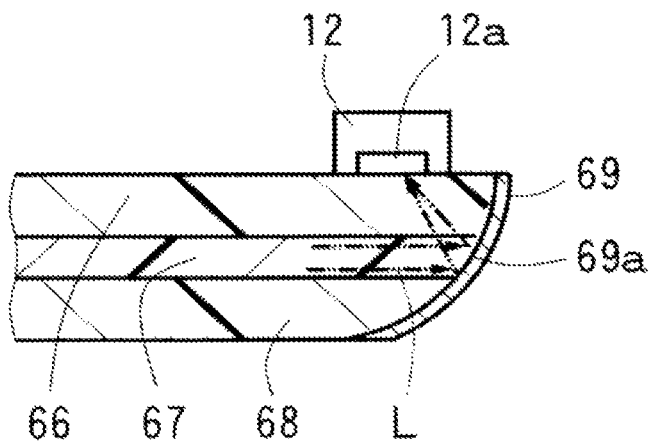
FIG. 5 is a schematic vertical sectional view of a conventional optical wiring board.

Then, as shown in FIG. 3D, portions (opposite end portions) of the optical waveguide W (positioned in a lower part as seen in the figure) corresponding to the mounting pads 2a of the electric circuit board E are formed into inclined surfaces inclined at 45 degrees with respect to the longitudinal direction of the core 7, for example, by excimer laser beam machining. At the same time, portions of the inclined surfaces corresponding to the core 7 are formed into the light reflecting surfaces 7a and 7b in the form of the concave surfaces. The concave surfaces are machined by scanning with a smaller laser spot (machining area). For cutting a portion deeper by the machining, a laser output or the number of times of machining is increased for the portion. In this manner, the optical waveguide W is formed on the back surface of the metal layer M.

Thereafter, the light-emitting element 11 and the light-receiving element 12 (with reference to FIG. 1A) are mounted on the mounting pads 2a. This provides the opto-electric hybrid board shown in FIG. 1A.

In the aforementioned embodiment, the light reflecting surfaces 7a and 7b are in the form of the concave surfaces curved in both the width direction and the thickness direction of the core 7. However, the light reflecting surfaces 7a and 7b may be in the form of concave surfaces curved only in the width direction of the core 7 or in the form of concave surfaces curved only in the thickness direction of the core 7. In that case, the radius of curvature of the concave surfaces is similar to that in the aforementioned embodiment.

In the aforementioned embodiment, a metal layer may be formed by evaporating metal such as gold onto the outside surfaces of the light reflecting surfaces 7a and 7b or by plating the outside surfaces of the light reflecting surfaces 7a and 7b with metal such as gold. In this case, the metal layer improves the efficiency of reflection from the light reflecting surfaces 7a and 7b to further reduce the propagation loss of the light L.

In the aforementioned embodiment, only the end portions of the core 7 which serve as the light reflecting surfaces 7a and 7b are formed into the concave surfaces. However, the concave surfaces may be formed to extend to the first cladding layer 6 and the second cladding layer 8.

Both of the light reflecting surfaces 7a and 7b in the opposite end portions of the core 7 are made in the form of the concave surfaces in the aforementioned embodiment. However, only one of the light reflecting surfaces 7a and 7b may be made in the form of a concave surface according to circumstances. In that case, the other end portion may be in the form of a planar inclined surface (light reflecting surface) inclined with respect to the longitudinal direction of the core 7 or in the form of a planar perpendicular surface (light-permeable surface) perpendicular to the longitudinal direction of the core 7. The light-permeable surface may be configured for connection to an end portion of an optical fiber.

The metal layer M for reinforcement is provided in the aforementioned embodiment, but need not necessarily be provided under certain circumstances. In this case, the opto-electric hybrid board is produced in a manner to be described below. For example, the electric circuit board E is formed on a releasable base in a manner similar to that in the aforementioned embodiment. Thereafter, the releasable base is released from the electric circuit board E. Then, the optical waveguide W is formed on the back surface (surface opposite from the surface with the electrical interconnect lines 2 formed thereon) of the insulative layer 1 of the electric circuit board E in a manner similar to that in the aforementioned embodiment.

The opto-electric hybrid board is produced in the aforementioned embodiment by initially forming the electric circuit board E provided with the metal layer M, then forming the optical waveguide W on the electric circuit board E and finally mounting the light-emitting element 11 and the light-receiving element 12. Other steps may be performed to produce the opto-electric hybrid board. Examples of the steps for the production of the opto-electric hybrid board may include: individually forming the optical waveguide W and the electric circuit board E with the light-emitting element 11 and the like mounted thereon; and mounting the electric circuit board E on the optical waveguide W.

The insulative layer 1 is permeable to light in the aforementioned embodiment, but may be impermeable to light. In that case, through holes for an optical path are formed in the insulative layer 1. Also, when the first cladding layer 6 is insulative, the electrical interconnect lines 2 (including the mounting pads 2a) may be formed directly on a surface of the first cladding layer 6.

Next, inventive examples of the present invention will be described in conjunction with comparative examples. It should be noted that the present invention is not limited to the inventive examples.

EXAMPLES

[Material for Formation of Core]
Component a: 50 parts by weight of o-cresol novolac glycidyl ether (YDCN-700-10 available from. Nippon Steel & Sumikin Chemical Co., Ltd.).
Component b: 50 parts by weight of bisphenoxyethanol-fluorene diglycidyl ether (OGSOL EG available from Osaka Gas Chemicals Co., Ltd.).
Component c: 1 part by weight of a photo-acid generator (SP170 available from ADEKA Corporation).
Component d: 50 parts by weight of ethyl lactate (solvent available from Musashino Chemical Laboratory, Ltd.)
A material for the formation of a core was prepared by mixing these components a to d together.

[Materials for Formation of First and Second Cladding Layers]
Component e: 20 parts by weight of an epoxy resin containing an alicyclic skeleton (EHPE 3150 available from Daicel Corporation).
Component f: 80 parts by weight of a liquid long-chain bifunctional semi-aliphatic epoxy resin (EXA-4816 available from DIC Corporation).
Component g: 2 parts by weight of a photo-acid generator (SP170 available from ADEKA Corporation).
Component h: 40 parts by weight of ethyl lactate (solvent available from Musashino Chemical Laboratory, Ltd.).
A material for the formation of first and second cladding layers was prepared by mixing these components e to h together.

Using the aforementioned materials, opto-electric hybrid boards in Inventive Examples 1 to 14 and Comparative Examples 1 to 9 including light reflecting surfaces in the form of concave surfaces having radii of curvature listed in TABLES 1 to 3 below were produced in the same manner as in the aforementioned embodiment. In each of the opto-electric hybrid boards, a concave surface (light reflecting surface) was formed only in a first end portion of the core, whereas a planar perpendicular surface (light-permeable surface) perpendicular to the longitudinal direction of the core was formed in a second end portion thereof. A mounted optical element was a light-receiving element (PDCS32T-XS available from Albis Optoelectronics AG). The core had a width of 50 μm, and a thickness of 50 μm. The first cladding layer had a thickness (thickness as measured from the back surface of a metal layer) was 5 μm. The light reflecting surfaces in Comparative Examples 3, 6 and 9 were planar inclined surfaces (radii of curvature of ∞).

[Light Propagation Loss]
A light-emitting element (laser stabilized light source known under the trade name of OP-250-LS-MM50 available from OptoTest Corporation) was connected to a first end portion of an optical fiber [GI (graded index) fiber with a diameter of 50 μm and NA (numerical aperture) of 0.22]. The amount of light A was measured when light emitted from the light-emitting element and exiting from a second end portion of the optical fiber was directly received by the light-receiving element before mounting. Next, the second end portion of the optical fiber was connected to the light-permeable surface (the second end portion of the core) of each of the opto-electric hybrid boards. The amount of light B was measured when light emitted from the light-emitting element and exiting from the second end portion of the optical fiber was received by the light-receiving element via the core of an optical waveguide of each of the opto-electric hybrid boards. The ratio (A/B) was calculated, and the calculated value was determined as the propagation loss of light in each of the opto-electric hybrid boards. The results are listed in TABLES 1 to 3 below. The distance from an interface between the first cladding layer and the core to a light-receiving portion of the light-receiving element was 30 μm.

TABLE 1

| | | Inventive Examples | | | | | Comparative Examples | | |
|---|---|---|---|---|---|---|---|---|---|
| | | 1 | 2 | 3 | 4 | 5 | 1 | 2 | 3 |
| Radius of curvature (μm) | Core width direction | 51 | 101 | 500 | 1000 | 1300 | 30 | 1500 | ∞ |
| | Core thickness direction | | | | | ∞ | | | |
| | Light propagation loss (dB) | 2.3 | 1.1 | 1.9 | 2.1 | 2.2 | 4.8 | 2.4 | 2.4 |

TABLE 2

|  |  | Inventive Examples | | | | Comparative Examples | | |
| --- | --- | --- | --- | --- | --- | --- | --- | --- |
|  |  | 6 | 7 | 8 | 9 | 4 | 5 | 6 |
| Radius of curvature ($\mu$m) | Core width direction | ∞ | ∞ | ∞ | ∞ | ∞ | ∞ | ∞ |
|  | Core thickness direction | 201 | 501 | 1000 | 1300 | 100 | 1500 | ∞ |
| Light propagation loss (dB) |  | 1.6 | 1.5 | 1.9 | 2.1 | 3.9 | 2.4 | 2.4 |

TABLE 3

|  |  | Inventive Examples | | | | | Comparative Examples | | |
| --- | --- | --- | --- | --- | --- | --- | --- | --- | --- |
|  |  | 10 | 11 | 12 | 13 | 14 | 7 | 8 | 9 |
| Radius of curvature ($\mu$m) | Core width direction | 51 | 101 | 500 | 1000 | 1300 | 30 | 1500 | ∞ |
|  | Core thickness direction | 201 | 501 | 1000 | 1000 | 1300 | 100 | 1500 | ∞ |
| Light propagation loss (dB) |  | 1.6 | 0.4 | 1.4 | 1.6 | 2.0 | 6.1 | 2.4 | 2.4 |

The results in TABLES 1 to 3 show that the light propagation losses are low in Inventive Examples 1 to 14 in which the radii of curvature of the light reflecting surfaces are within a predetermined range, and that the light propagation losses are high in Comparative Examples 1 to 9 in which the radii of curvature of the light reflecting surfaces fall outside the predetermined range.

Although specific forms in the present invention have been described in the aforementioned examples, the aforementioned examples should be considered as merely illustrative and not restrictive. It is contemplated that various modifications evident to those skilled in the art could be made without departing from the scope of the present invention.

The opto-electric hybrid board according to the present invention is applicable toa sufficient reduction in light propagation loss.

REFERENCE SIGNS LIST

L Light
W Optical waveguide
1 Insulative layer
2 Electrical interconnect lines
6 First cladding layer
7 Core
7a and 7b Light reflecting surfaces
8 Second cladding layer
11 Light-emitting element
12 Light-receiving element

The invention claimed is:

1. An opto-electric hybrid board comprising:
an optical waveguide including a linear core for an optical path, and two cladding layers holding the core therebetween;
an electrical interconnect line formed on a surface of one of the cladding layers either directly or with another layer therebetween; and
an optical element mounted on part of the electrical interconnect line,
wherein a light reflecting surface for reflecting light, allowing the light to propagate between the core and the optical element, is formed in an end portion of the core of the optical waveguide, and wherein the light reflecting surface is in the form of any one of:
(A) a concave surface curved only in a width direction of the core and having a radius of curvature having a value greater than 50 $\mu$m and less than 1500 $\mu$m;
(B) a concave surface curved only in a thickness direction of the core and having a radius of curvature having a value greater than 200 $\mu$m and less than 1500 $\mu$m; and
(C) a concave surface curved in the width direction and the thickness direction of the core, and having a radius of curvature having a value greater than 50 $\mu$m and less than 1500 $\mu$m as measured in the width direction of the core and a radius of curvature having a value greater than 200 $\mu$m and less than 1500 $\mu$m as measured in the thickness direction of the core,
wherein the thickness direction of the core is a direction in which the core and the two cladding layers are stacked,
wherein the width direction of the core is a direction perpendicular to the thickness direction and perpendicular to a light propagation direction of the core, and
wherein the end portion of the core is uncovered.

2. An opto-electric hybrid board production method, comprising:
forming an optical waveguide including a linear core for an optical path, and two cladding layers holding the core therebetween;
forming an electrical interconnect line on a surface of one of the cladding layers either directly or with another layer therebetween; and
mounting an optical element on part of the electrical interconnect line,
wherein a light reflecting surface for reflecting light, allowing the light to propagate between the core and the optical element, is formed by laser beam machining in an end portion of the core of the optical waveguide so that the light reflecting surface is uncovered, wherein the light reflecting surface is in the form of any one of:
   (A) a concave surface curved only in a width direction of the core and having a radius of curvature having a value greater than 50 μm and less than 1500 μm;
   (B) a concave surface curved only in a thickness direction of the core and having a radius of curvature having a value greater than 200 μm and less than 1500 μm; and
   (C) a concave surface curved in the width direction and the thickness direction of the core, and having a radius of curvature having a value greater than 50 μm and less than 1500 μm as measured in the width direction of the core and a radius of curvature having a value greater than 200 μm and less than 1500 μm as measured in the thickness direction of the core,
wherein the thickness direction of the core is a direction in which the core and the two cladding layers are stacked, and
wherein the width direction of the core is a direction perpendicular to the thickness direction and perpendicular to a light propagation direction of the core.

* * * * *